United States Patent
Lindkvist

(10) Patent No.: US 7,302,657 B2
(45) Date of Patent: Nov. 27, 2007

(54) OPTIMIZATION OF THE DESIGN OF A SYNCHRONOUS DIGITAL CIRCUIT

(75) Inventor: Hans Lindkvist, Lund (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 255 days.

(21) Appl. No.: 10/493,889

(22) PCT Filed: Sep. 26, 2002

(86) PCT No.: PCT/EP02/10750

§ 371 (c)(1),
(2), (4) Date: Nov. 10, 2004

(87) PCT Pub. No.: WO03/038687

PCT Pub. Date: May 8, 2003

(65) Prior Publication Data

US 2005/0132313 A1    Jun. 16, 2005

Related U.S. Application Data

(60) Provisional application No. 60/330,856, filed on Nov. 1, 2001.

(30) Foreign Application Priority Data

Oct. 29, 2001    (EP)    ................................. 01610111

(51) Int. Cl.
*G06F 17/50*    (2006.01)
(52) U.S. Cl. ............................................. 716/6; 716/10
(58) Field of Classification Search ............... 716/6, 716/10
See application file for complete search history.

(56) References Cited

U.S. PATENT DOCUMENTS

| 5,122,679 A | 6/1992 | Ishii et al. |
| 5,572,714 A * | 11/1996 | Nakakura ................... 713/500 |
| 5,764,528 A | 6/1998 | Nakamura |
| 5,852,640 A | 12/1998 | Kliza et al. |
| 5,983,007 A | 11/1999 | Agrawal |
| 6,025,740 A | 2/2000 | Fukuyama |

(Continued)

FOREIGN PATENT DOCUMENTS

WO    00/75815 A1    12/2000

OTHER PUBLICATIONS

Tolga Soyata, et al., "Integration of Clock Skew and Register Delays into a Retiming Algorithm", May 1993 IEEE, pp. 1483-1486, New York U.S.A., ISBN: 0-7803-1281-3.

(Continued)

*Primary Examiner*—Paul Dinh
*Assistant Examiner*—Suchin Parihar
(74) *Attorney, Agent, or Firm*—Potomac Patent Group PLLC

(57) ABSTRACT

The design of a synchronous digital circuit (1) can be modified. The circuit comprises a number of clocked storage devices (2, 3, 4, 5,) and a number of combinational logic elements defining combinational paths (6, 7, 8, 9,) between at least some of said clocked storage devices. Each combinational path from an output of one clocked storage device to an input of another has a minimum delay value ($D_{min}$) and a maximum delay value ($D_{max}$). The actual delay of the path assumes a value between the minimum and maximum delay values. The method comprises the steps of identifying the path (6; 7; 8; 9) having the greatest difference between the maximum delay value ($D_{max}$) and the minimum delay value ($D_{MIN}$), and reducing said difference by increasing the minimum delay value for the path having the greatest difference. With the method a higher clock frequency for the circuit can be achieved.

9 Claims, 12 Drawing Sheets

U.S. PATENT DOCUMENTS

| | | | |
|---|---|---|---|
| 6,424,688 B1 * | 7/2002 | Tan et al. | 375/354 |
| 6,553,550 B1 * | 4/2003 | Menegay et al. | 716/6 |
| 6,598,139 B2 * | 7/2003 | Kawaguchi et al. | 711/167 |
| 6,782,519 B2 * | 8/2004 | Chang et al. | 716/6 |
| 7,138,851 B2 * | 11/2006 | Sumita et al. | 327/534 |
| 2001/0007144 A1 | 7/2001 | Terazawa | |
| 2001/0010092 A1 * | 7/2001 | Kato | 716/10 |
| 2003/0182634 A1 * | 9/2003 | Chang et al. | 716/1 |
| 2004/0210857 A1 * | 10/2004 | Srinivasan | 716/2 |
| 2007/0132504 A1 * | 6/2007 | Sumita et al. | 327/534 |

OTHER PUBLICATIONS

Tolga Soyata, et al., "Synchronous Performance and Reliability Improvement in Pipelined ASICs", Sep. 1994 IEEE, pp. 383-390, New York U.S.A., ISBN: 0-7803-2020-4.

Harsha Sathyamurthy, et al., "Speeding up Pipelined Circuits through a Combination of Gate Sizing and Clock Skew Optimization", Feb. 1998 IEEE, 4 pages, New York U.S.A., ISSN: 0278-0070.

* cited by examiner

| Comb | $D_{max}$ (ns) | $D_{min}$ (ns) | Diff (ns) |
|---|---|---|---|
| a - b | 5 | 1 | 4 |
| b - c | 3 | 1 | 2 |
| c - d | 3 | 1 | 2 |
| b - d | 20 | 3 | 18 |
| b - c - d | 3 + 3 | 1 + 1 | |

| Comb | $D_{max}$ (ns) | $D_{min}$ (ns) | Diff (ns) |
|---|---|---|---|
| a - b | 5 | 1 | 4 |
| b - c | 5.5 | 5.5 | 0 |
| c - d | 3 | 2 | 1 |
| b - d | 20 | 7.5 | 12.5 |
| b - c - d | 5.5 + 3 | 5.5 + 2 | |

| Comb | $D_{max}$ (ns) | $D_{min}$ (ns) | Diff (ns) |
|---|---|---|---|
| a - b | 5 | 1 | 4 |
| b - c | 8 | 8 | 0 |
| c - d | 5 | 4 | 1 |
| b - d | 20 | 12 | 8 |
| b - c - d | 8 + 5 | 8 + 4 | |

| Comb | $D_{max}$ (ns) | $D_{min}$ (ns) | Diff (ns) |
|---|---|---|---|
| a - b | 7 | 1 | 6 |
| b - c | 20 | 3 | 17 |
| c - d | 3 | 1 | 2 |
| b - d | 3 | 1 | 11 |
| b - c - d | 20 + 3 | 3 + 1 | |

| Comb | $D_{max}$ (ns) | $D_{min}$ (ns) | Diff (ns) |
|---|---|---|---|
| a - b | 7 | 1 | 6 |
| b - c | 20 | 10 | 10 |
| c - d | 3 | 1 | 2 |
| b - d | 3 | 1 | 11 |
| b - c - d | 20 + 3 | 10 + 1 | |

| Comb | $D_{max}$ (ns) | $D_{min}$ (ns) | Diff (ns) |
|---|---|---|---|
| a - b | 7 | 1 | 6 |
| b - c | 20 | 10 | 10 |
| c - d | 3 | 1 | 2 |
| b - d | 3 | 3 | 10 |
| b - c - d | 20 + 3 | 10 + 1 | |

OPTIMIZATION OF THE DESIGN OF A SYNCHRONOUS DIGITAL CIRCUIT

This application is a national stage application of PCT International Application No. PCT/EP02/10750, filed 26 Sep. 2002, which claims priority from European Patent Application No. 01610111.5 filed 29 Oct. 2001 and from U.S. Provisional Application No. 60/330,856 filed 1 Nov. 2001.

TECHNICAL FIELD OF THE INVENTION

The invention relates to a method of modifying the design of a synchronous digital circuit comprising a number of clocked storage devices and a number of combinational logic elements defining combinational paths between at least some of said clocked storage devices, each combinational path from an output of a first one of said clocked storage devices to an input of a second one of said clocked storage devices having a minimum delay value and a maximum delay value, such that the actual delay of said path assumes a value between the minimum delay value and the maximum delay value. The invention further relates to a system for modifying the design of such a circuit, and to a computer readable medium having instructions for causing a processing unit to execute the method.

DESCRIPTION OF RELATED ART

In digital synchronous circuits clock signals are used to synchronize computations. Digital signals are stored in storage elements awaiting a synchronizing clock pulse. The storage elements are typically interconnected by combinational logic. Each storage element delays the signal by a single clock period. Synchronizing the storage elements with clock signals reduces the uncertainty in delay between sending and receiving signals in the storage elements. The storage elements, such as registers, latches and flip-flops, sample output signals of the combinational logic, preserve the values internally as the state of the circuit, and make the state available for new computations after a certain delay.

Pushing the frequency of the clock signal of a digital synchronous circuit towards higher frequencies to obtain a higher rate of calculation in the logic has been, is still, and will most likely continue to be one of the most important optimization objectives in the design of digital synchronous circuits.

Most current schemes for optimizing the maximal clock frequency of digital circuits are focused on circuits with so-called zero-skew or minimal skew clock distribution. This zero-skew or minimal skew clock distribution is based on distributing clock signals to storage elements concentrating on ensuring a high degree of synchronism of all clock signals. The clock signals are typically distributed in a tree-like structure, whereby delays in different branches can be balanced to a high degree. The major benefit of such schemes is that uniformity brings predictability and simplifies the overall design problem. Zero-skew or minimal skew clock distribution is e.g. known from U.S. Pat. No. 5,122,679, U.S. Pat. No. 5,852,640 and U.S. Pat. No. 6,025,740. However, the performance of this kind of circuit is limited by the longest combinatorial delay among local paths between any pair of storage elements.

Alternatives to the zero- and minimal-skew clock distribution scheme exist, but are less frequently used. In unidirectional pipelines it is common practice to distribute the clock signal in the direction opposite to the data flow. However, complex ASIC designs are rarely suitable for this method, since their data flow is complex and irregular.

Performance tuning through intentional clock skew is also used, either through explicit designer decisions to redistribute computation time between two pipeline stages, or through the use of special CAD tools, such as the tool "ClockWise" offered by Ultima Interconnect Technologies. The theoretical limit for the performance of an intentional clock skew scheme should be defined by the mean value of the longest delays in the loop having the highest mean value of the longest delays. However, practice has shown that the highest obtainable clock frequency is considerably lower than the theoretical limit, because it is also limited by other factors.

The intentional clock skew scheme is also used in combination with other methods. H. Sathyamurthy et al, "Speeding up Pipelined Circuits through a Combination of Gate Sizing and Clock Skew Optimization" describes an algorithm in which manipulation of clock skew is combined with gate sizing, i.e. reduction of the delay of e.g. a gate by changing the dimensions of the transistors of the gate. However, gate sizing implies an increased circuit area and a higher power dissipation of the circuit. T. Soyata et al, "Integration of Clock Skew and Register Delays into a Retiming Algorithm" (0-7803-1254-5/93), IEEE, 1993 combines the use of clock skew with a retiming process in which registers of a synchronous circuit are relocated within the circuit in order to achieve a higher clock frequency. This relocation of registers is a very complex process for complicated circuits, because the relocation of a register typically requires the use of several new registers to replace the one that was relocated.

Therefore, it is an object of the invention to provide a method of the above-mentioned type in which the clock frequency of a synchronous digital circuit can be increased in a relatively simple way without the use of the very complex or power consuming methods mentioned above.

SUMMARY

According to the invention the object is achieved in that the method comprises the steps of identifying the combinational path having the largest difference between the maximum delay value and the minimum delay value, and reducing said difference between the maximum delay value and the minimum delay value by increasing the minimum delay value for said combinational path having the largest difference.

The minimum delay value of a combinational path can often be increased easily, and thus this is a very simple way of reducing the difference between the maximum delay value and the minimum delay value. Since the greatest one of these difference values can be shown to be the lower limit for the usable clock period, a reduction will allow a shorter clock period and thus a higher clock frequency of the circuit.

When the greatest difference in case of parallel paths is calculated as the difference between the highest maximum delay value and the lowest minimum delay value, it is ensured that the situation where one path has the lowest minimum delay value and another the highest maximum delay value is also taken into account. When further the maximum delay value for a sequential path is calculated as the sum of the maximum delay values for the paths comprised in the sequential path, and the minimum delay value for a sequential path is calculated as the sum of the minimum delay values for the paths comprised in the sequential path, also this situation can be taken into account.

When the step of increasing the minimum delay value for a combinational path is performed by inserting a number of buffers in the combinational path, a very simple and cost effective method is achieved.

When the method further comprises the steps of identifying among sequential paths from an input to an output of the circuit and sequential paths defining loops in the circuit the sequential path having the highest mean value of the maximum delay values, calculating said highest mean value of the maximum delay values, identifying those paths for which the difference between the maximum delay value and the minimum delay value exceeds said highest mean value of the maximum delay values, and reducing said differences exceeding the highest mean value of the maximum delay values to be less than or equal to said highest mean value of the maximum delay values, it is possible to design circuits that can be clocked with the highest possible clock frequency, because the highest mean value of the maximum delay values is the lower limit for the clock period for a circuit where the input and the output should be clocked simultaneously, or for circuits in which loops occur due to feed-back-couplings.

As mentioned, the invention also relates to a system for modifying the design of a synchronous digital circuit comprising a number of clocked storage devices and a number of combinational logic elements defining combinational paths between at least some of said clocked storage devices, each combinational path from an output of a first one of said clocked storage devices to an input of a second one of said clocked storage devices having a minimum delay value and a maximum delay value, such that the actual delay of said path assumes a value between the minimum delay value and the maximum delay value.

When the system comprises means for identifying the combinational path having the greatest difference between the maximum delay value and the minimum delay value, and means for reducing said difference between the maximum delay value and the minimum delay value by increasing the minimum delay value for said combinational path having the largest difference, the system will be able to increase the clock frequency of a synchronous digital circuit in a relatively simple way without the use of the very complex or power consuming methods mentioned above. The minimum delay value of a combinational path can often be increased easily, and thus this is a very simple way of reducing the difference between the maximum delay value and the minimum delay value. Since the greatest one of these difference values can be shown to be the lower limit for the usable clock period, a reduction will allow a shorter clock period and thus a higher clock frequency of the circuit.

When the system is adapted to calculate the largest difference in case of parallel paths as the difference between the highest maximum delay value and the lowest minimum delay value, it is ensured that the situation where one path has the lowest minimum delay value and another the highest maximum delay value is also taken into account. When the system is further adapted to calculate the maximum delay value for a sequential path as the sum of the maximum delay values for the paths comprised in the sequential path, and to calculate the minimum delay value for a sequential path as the sum of the minimum delay values for the paths comprised in the sequential path, also this situation can be taken into account.

When the system is adapted to increase the minimum delay value for a combinational path by the insertion of a number of buffers in the combinational path, a simple and cost effective system is achieved.

When the system further comprises means for identifying among sequential paths from an input to an output of the circuit and sequential paths defining loops in the circuit the sequential path having the highest mean value of the maximum delay values, means for calculating said highest mean value of the maximum delay values, means for identifying those paths for which the difference between the maximum delay value and the minimum delay value exceeds said highest mean value of the maximum delay values, and means for reducing said differences exceeding the highest mean value of the maximum delay values to be less than or equal to said highest mean value of the maximum delay values, it is possible to design circuits that can be clocked with the highest possible clock frequency, because the highest mean value of the maximum delay values is the lower limit for the clock period for a circuit where the input and the output should be clocked simultaneously, or for circuits in which loops occur due to feed-back couplings.

As mentioned, the invention further relates to a computer readable medium having stored therein instructions for causing a processing unit to execute the above method. With this medium a system as described above can be implemented on a normal computer.

BRIEF DESCRIPTION OF THE DRAWINGS

The invention will now be described more fully below with reference to the drawings, in which.

DETAILED DESCRIPTION OF EMBODIMENTS

Figure 1:
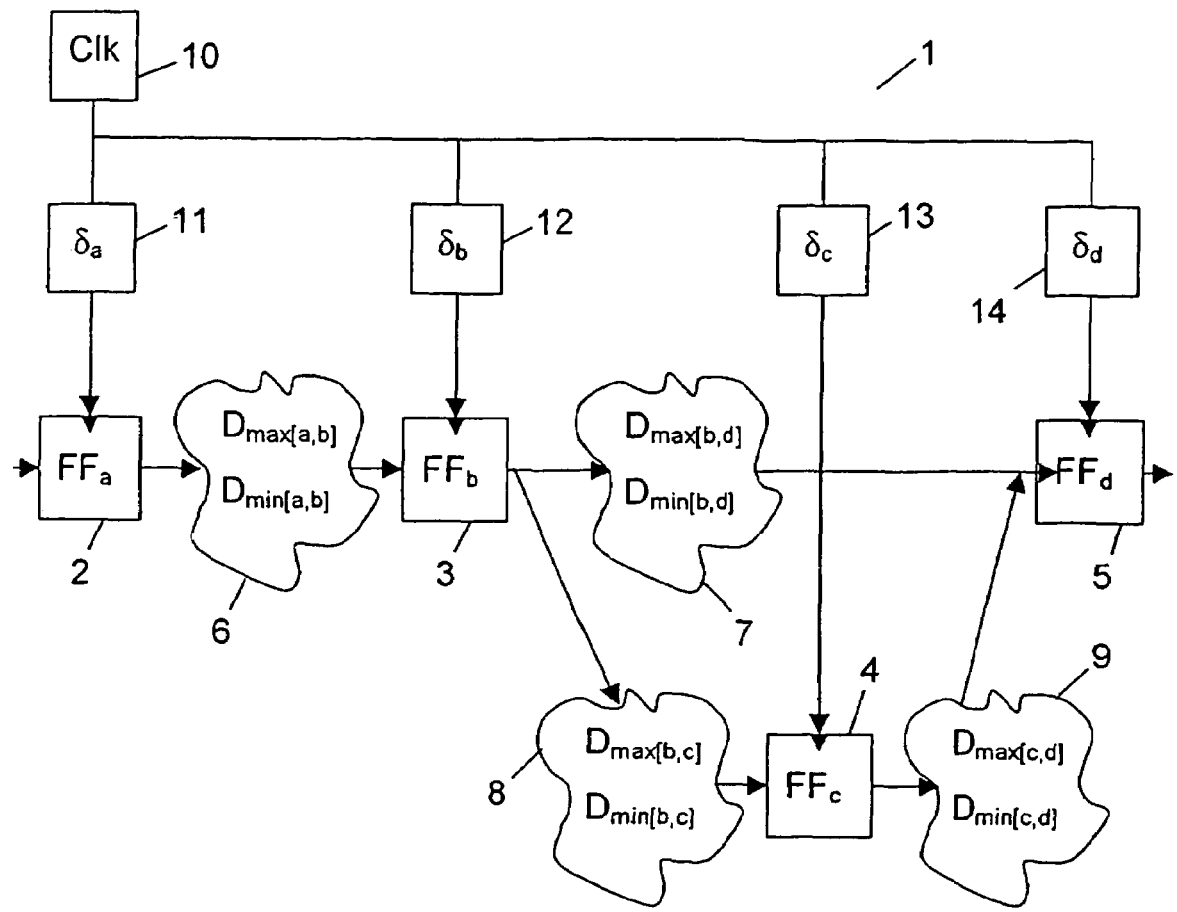
FIG. 1 shows a synchronous digital circuit in which the invention can be applied.

FIG. 1 illustrates an example of a synchronous digital circuit 1 having four registers 2, 3, 4, and 5 and four blocks of combinational logic 6, 7, 8 and 9. The registers 2, 3, 4, and 5 are also designated $FF_a$, $FF_b$, $FF_c$ and $FF_d$, and they are clocked from a clock source 10. The clock is subjected to certain insertion delays $\delta_a$, $\delta_b$, $\delta_c$ and $\delta_d$, indicated by the delay blocks 11, 12, 13 and 14, as it is distributed to the registers.

Each of the combinational logic blocks 6, 7, 8 and 9 delays the digital signals passing through them. The delay of a combinational logic block, i.e. the delay from the output of one register to the input of another register, may vary between a shortest combinational delay $D_{min}$ and a longest combinational delay $D_{max}$. Thus the delay of e.g. the block 6, i.e. the delay from the output of register $FF_a$ to the input of register $FF_b$, may vary between a shortest combinational delay $D_{min[a,b]}$ and a longest combinational delay $D_{max[a,b]}$.

Figure 2:
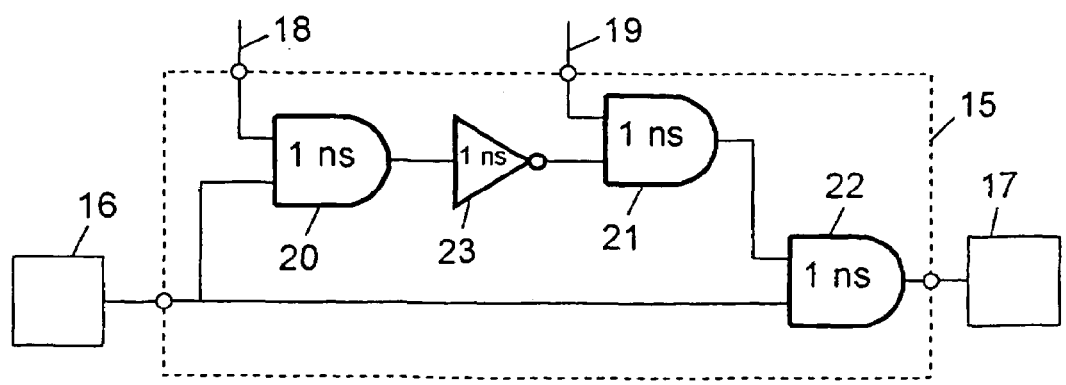
FIG. 2 shows an example of a combinational circuit that can be used in the circuit of FIG. 1.

Very often $D_{min}$ is considerably smaller than $D_{max}$ which is illustrated by the combinational circuit 15 shown in FIG. 2 which could be any of the combinational logic blocks 6, 7, 8 and 9 in FIG. 1. The circuit 15 is connected between the output of a register 16 and the input of another register 17, and it is further connected to two external signals 18 and 19. These signals may be asynchronous signals or synchronous signals. However, we assume that they are stable when a change propagates through the circuit. The circuit 15 comprises the AND gates 20, 21 and 22 and an inverter 23. Each gate and inverter is supposed to have a delay of one nanosecond. It is seen that if the output from register 16 e.g. changes from a "1" to a "0" in a situation where the output of the circuit 15 is a "1", the output will change to a "0" independent of the rest of the circuit already after 1 ns because the signal only has to propagate through gate 22. Thus $D_{min[16,17]}$ is 1 ns. In other situations, however, the output signal will also depend on the external signals 18 and 19, the gates 20, 21 and the inverter 23, and it will have to propagate through all gates/inverters before the output is ready. This will take 4 ns and thus $D_{max[16,17]}$ is 4 ns.

Figure 3:
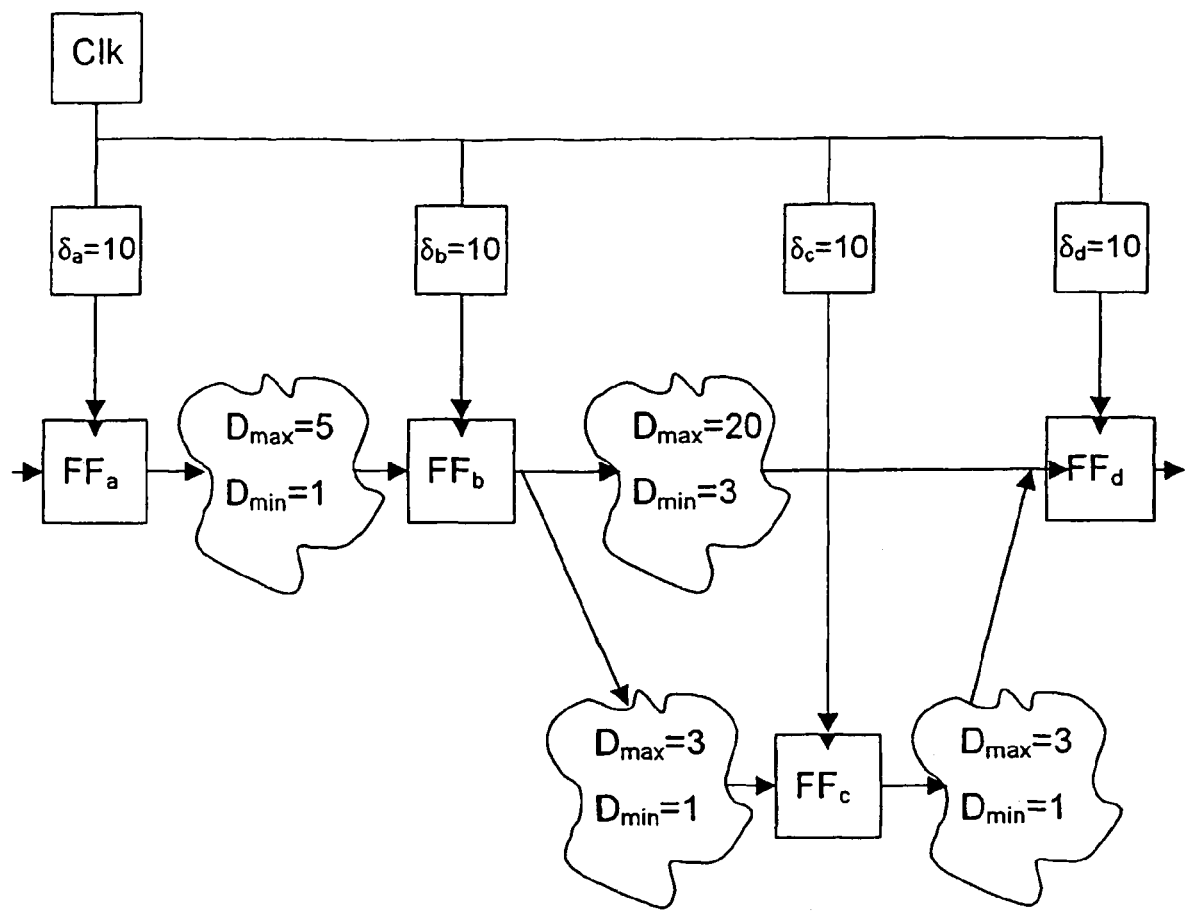
FIG. 3 shows the circuit of FIG. 1 with examples of specific values of the delays.
Figure 4:
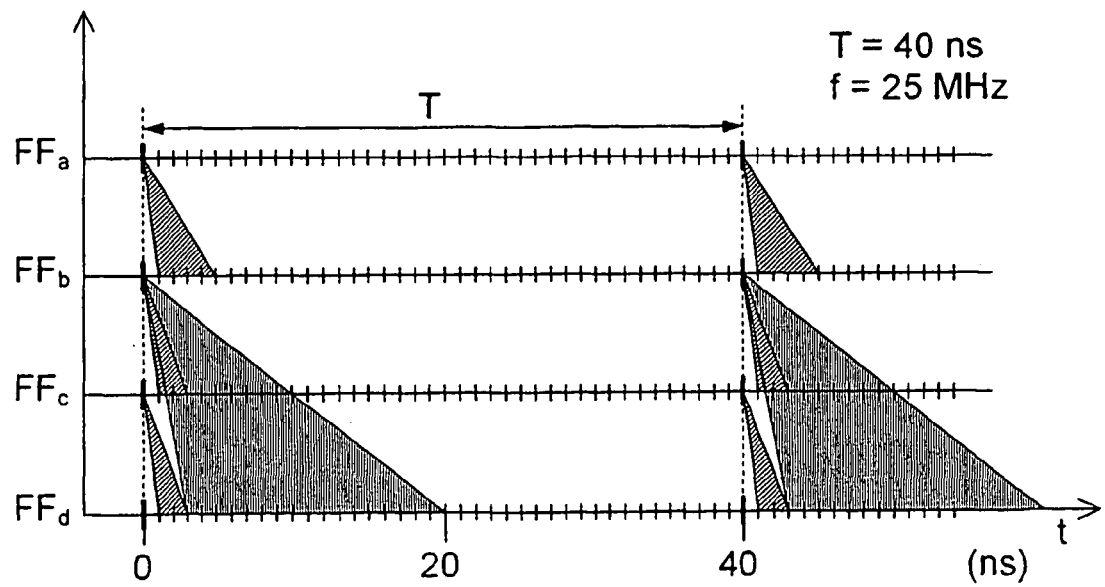
FIG. 4 shows a timing diagram for the circuit of FIG. 3.

FIG. 3 shows the circuit of FIG. 1 with specific values of the longest and shortest combinational delays and of the insertion delays of the clock signals. It is seen that all four insertion delays are set to 10 ns corresponding to a traditional zero-skew clocking scheme. FIG. 4 illustrates how the timing of the circuit could be.

It should be noted that for reasons of simplicity the time required for the data at the input of a register to latch, i.e. the set-up time, and the time required for the data to appear at the output of the register upon arrival of the clock signal are not taken into account. The same is true for the hold time of the register. In practice these times should also be considered, which will complicate the exact calculations but not change any of the following conclusions.

In the example the clock frequency is chosen to 25 MHz, corresponding to a clock period of 40 ns, which is well below the maximum clock frequency of the circuit. At the time t=0 all four registers are clocked, and their output signals are ready. If we look at the combinational logic block connecting the output of $FF_a$ to the input of $FF_b$, $D_{min[a,b]}$ is 1 ns and $D_{max[a,b]}$ is 5 ns, which means that the input of $FF_b$ may change already after 1 ns but it may also take up to 5 ns before it is ready. This is illustrated by the shaded area in the upper part of FIG. 4. Similarly, the signal from $FF_b$ to $FF_c$ will arrive between 1 and 3 ns, the signal from $FF_c$ to $FF_d$ also between 1 and 3 ns, and the signal from $FF_b$ to $FF_d$ (i.e. the direct route) between 3 and 20 ns, which is also illustrated with shaded areas. It is seen that after 20 ns (i.e. $D_{max[b,d]}$) all input signals to the registers are ready for the next clock pulse to arrive.

Figure 5:
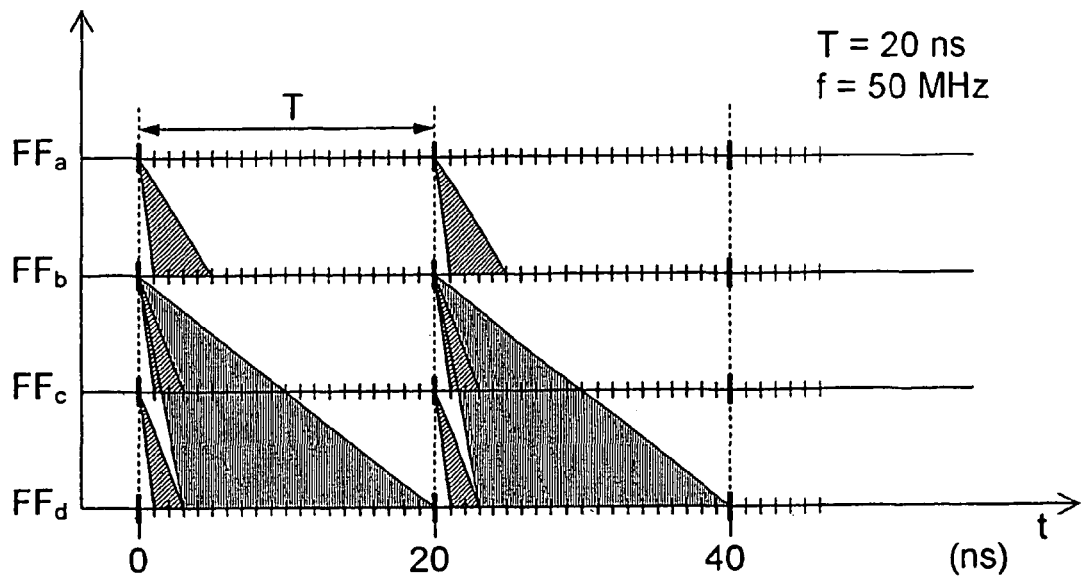
FIG. 5 shows an alternative timing diagram for the circuit of FIG. 3.

Thus the clock period (T) in FIG. 4 can be reduced from the 40 ns to any value down to 20 ns. Values below 20 ns are not possible because $FF_d$ should not be clocked before its input signal is guaranteed to be ready. The situation with the clock period reduced to 20 ns, i.e. the clock frequency increased to 50 MHz, is shown in FIG. 5. It is supposed that $D_{max[b,d]}$ cannot be reduced below the 20 ns, and thus 50 MHz is the highest obtainable clock frequency when zero-skew is used.

However, intentional clock skew allows the clock frequency to be increased further. Intentional clock skew means that the registers are allowed to be clocked at different times, i.e. the registers will have different δ values. Registers $FF_a$ and $FF_d$ will normally have to be clocked simultaneously because they represent the input and the output of the entire circuit, but it is seen from FIG. 5 that the registers $FF_b$ and $FF_c$ may be clocked earlier, because the data at their inputs have been ready for 15 and 17 ns, respectively, prior to the arrival of the clock pulse. Especially, if $FF_b$ is clocked earlier, the data at the input of $FF_d$ would be ready earlier, and $FF_d$ could thus be clocked earlier with a reduction of the clock period being the result.

Although $FF_a$ and $FF_d$ are normally clocked simultaneously, as mentioned, it is noted that this is not a necessary condition for the following considerations.

The basic requirements for clock scheduling for the circuit to function correctly can be formulated in the following expressions for all values of i, j where there is a combinational path from the output of register i to the input of register j, and where T is the clock cycle time:

$$\delta_i - \delta_j \leq T - D_{max[i,j]} \quad (1)$$

$$\delta_i - \delta_j \geq -D_{min[i,j]} \quad (2)$$

According to (1) $FF_i$ may be clocked later than $FF_j$ (positive skew), but not more than $T-D_{max[i,j]}$, because then the data would not reach $FF_j$ before the next clock signal. According to (2) $FF_i$ may be clocked before $FF_j$ (negative skew), but not more than $D_{min[i,j]}$, because then the data would reach $FF_j$ before it is clocked, i.e. a race condition would occur.

The requirement (1) can be used to calculate the smallest usable T. Since (1) must be true for any values of i, j, i.e. for any path from the output of one register to the input of another, it also must be true for combined paths. Thus $\Sigma(\delta_i - \delta_j) \leq \Sigma(T - D_{max[i,j]})$ for any combined path.

As an example, the circuit of FIG. 3 has two combined paths from its input to its output, i.e. the paths a-b-d (which will be used in the following to denote the path from register $FF_a$ through register $FF_b$ to register $FF_d$) and a-b-c-d, and thus $$(\delta_a - \delta_b) + (\delta_b - \delta_d) \leq (T - D_{max[a,b]}) + (T - D_{max[b,d]})$$

and $$(\delta_a - \delta_b) + (\delta_b - \delta_c) + (\delta_c - \delta_d) \leq (T - D_{max[a,b]}) + (T - D_{max[b,c]}) + (T - D_{max[c,d]})$$

Since $\delta_a$ is supposed to be equal to $\delta_d$, as mentioned above, these expressions can be rewritten to:

$$\delta_a - \delta_d = 0 \leq 2T - (D_{max[a,b]} + D_{max[b,d]})$$

and $$\delta_a - \delta_d = 0 \leq 3T - (D_{max[a,b]} + D_{max[b,c]} + D_{max[c,d]})$$

or $$T \geq (D_{max[a,b]} + D_{max[b,d]})/2$$

and $$T \geq (D_{max[a,b]} + D_{max[b,c]} + D_{max[c,d]})/3$$

Generally, the expression $$T \geq \Sigma(D_{max[i,j]})/n \quad (3)$$

must be true for any combination of paths, where n is the number of paths in the combined path.

This means that the clock period must be selected higher than the mean value of $D_{max}$ for a loop or a path from input to output of the circuit, and since this must be true for any such path, T must be greater than the mean value of $D_{max}$ for the loop/path with the highest mean value of the $D_{max}$ values. For the circuit of FIG. 3 this means that $T \geq (5 \text{ ns} + 20 \text{ ns})/2 = 12.5$ ns. Thus the smallest obtainable value of T can be calculated for any circuit of the above-mentioned type from these expressions.

The idea behind intentional clock skew is that the combinational block having the longest $D_{max}$ in the loop or path with the longest total sum of the $D_{max}$ values can "borrow" some of the time not utilized (so-called slack) by the other blocks of that loop/path, as long as the above requirement (3) is fulfilled.

Figure 6:
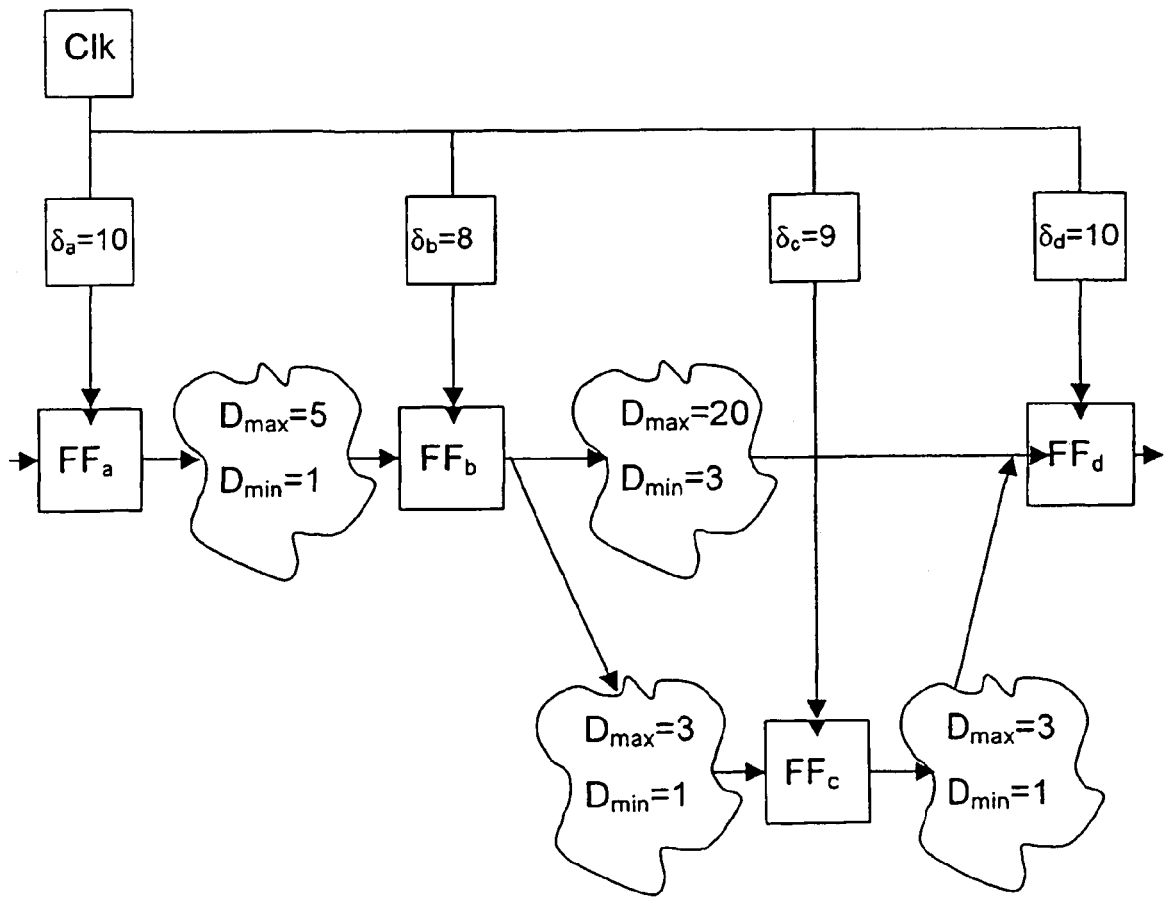
FIG. 6 shows the circuit of FIG. 3 modified with intentional clock skew.
Figures 7, 8:
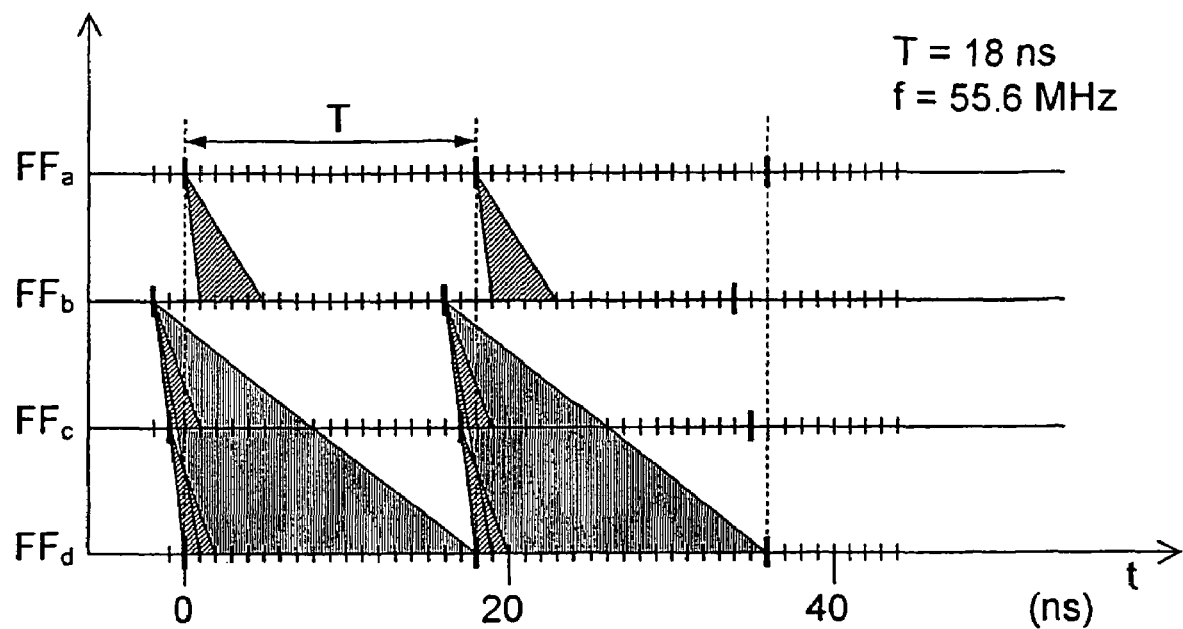
FIG. 7 shows a timing diagram for the circuit of FIG. 6.
FIG. 8 shows a table of difference values calculated for the circuit of FIG. 6.

Therefore, ideally it should be possible to reduce the clock period of the circuit of FIG. 3 to 12.5 ns. However, it is easily seen from FIG. 5 that this would cause a race condition to occur because the signal going from $FF_b$ via $FF_c$ to $FF_d$ would arrive at $FF_d$ too early. Intuitively it can be seen that in order to avoid this race condition the intentional clock skew must be limited to the values which are shown in FIGS. 6 and 7, because the clock frequency is actually also limited by the shortest combinational delays, not only the longest. The clock period can only be reduced to 18 ns corresponding to a clock frequency of 55.6 MHz. Although a clock period of 18 ns is better, than the original 20 ns, it is still far from the ideal value of 12.5 ns.

It will be seen from FIG. 7 that the problem is not that the combinational logic connecting $FF_b$ to $FF_d$ has a long $D_{max}$, but rather the big difference between $D_{max}$ and $D_{min}$ (including the parallel route via $FF_c$), because a clock period below, this difference is not possible when race conditions are to be avoided. This can also be seen from the requirements (1) and (2). When requirements (1) and (2) are combined, it is found for any values of i, j that:

$$-D_{min[i,j]} \leq T - D_{max[i,j]}, \text{ or } T \geq D_{max[i,j]} - D_{min[i,j]}. \quad (4)$$

Thus if the ideal lowest value of T calculated above violates (4), the lowest value of T will instead be limited by this expression. This is also called the "stiffness" of the circuit. Since also this expression must be true for any path of the circuit, the lowest usable clock period can be found by calculating the difference $D_{max} - D_{min}$ for each combinational block in the circuit. In case of parallel and/or sequential routes (like $FF_b$-$FF_d$ and $FF_b$-$FF_c$-$FF_d$ in the example of FIGS. 3 and 6) the sum of the $D_{max}$ values and the sum of the $D_{min}$ values for each route are calculated, and then $-\Sigma D_{min[i,j]} \leq (n_{max} \cdot T) - \Sigma D_{max[i,j]}$ must be true for any of the parallel routes, where $n_{max}$ is the number of sequential paths, i.e. the number of clock periods in the route for which $\Sigma D_{max[i,j]}$ calculated. The limiting value is then calculated as the highest $\Sigma D_{max}$ minus the lowest $\Sigma D_{min}$ divided by the number of clock periods ($n_{max}$) in the route with the highest $\Sigma D_{max}$. Thus the clock period which can be obtained by intentional clock skewing is limited by the formula $$T \geq \frac{\max[\sum D_{\max}] - \min[\sum D_{\min}]}{n_{\max}}. \quad (5)$$

In the table of FIG. 8 the difference values (Diff) according to (5) has been calculated for each combinational block in the circuit (Comb), and as the highest difference value is 18 ns, this will also be the limit for T in good correspondence with FIG. 7.

Figures 9, 10:
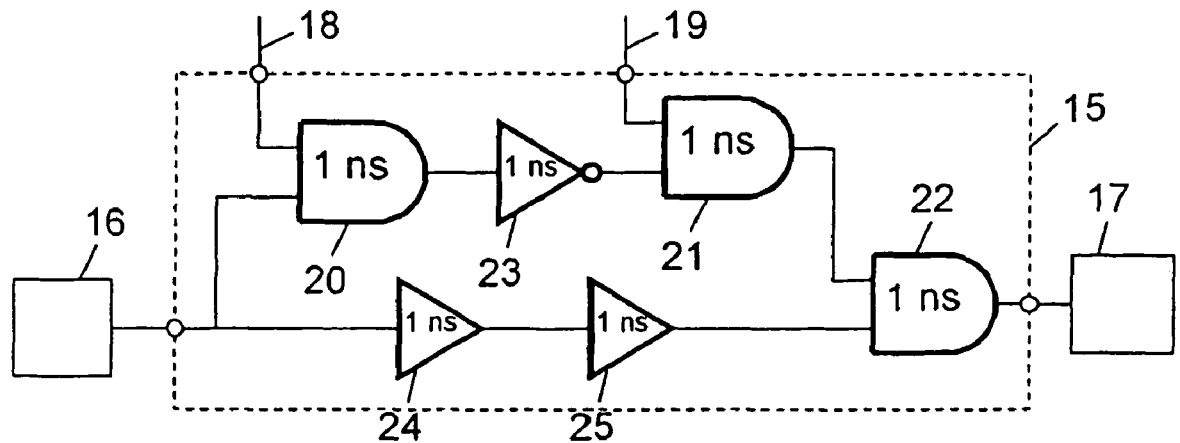
FIG. 9 shows the combinational circuit of FIG. 2 modified to have a longer minimum delay value.
FIG. 10 shows a table of difference values calculated with extended minimum delay values.

It follows from the above that if the clock period should be reduced further, the mentioned difference values also need to be reduced. It is supposed that the $D_{max}$ values cannot be reduced, or they are supposed to be reduced already as much as they can. However, according to the invention it will often be possible to increase the $D_{min}$ values without increasing the $D_{max}$ values, and that has the desired effect of reducing the difference values. FIG. 9 shows an example of how this can be done with the circuit from FIG. 2. In FIG. 9 the circuit has been modified by the insertion of two buffers 24 and 25 between the input of the circuit and the AND gate 22. When these buffers have a delay of 1 ns similar to the other gates, it is seen that $D_{min}$ for the circuit is increased from 1 ns to 3 ns while $D_{max}$ is unchanged 4 ns. Thus the difference value for the circuit has been reduced from 3 ns to 1 ns.

Figure 11:
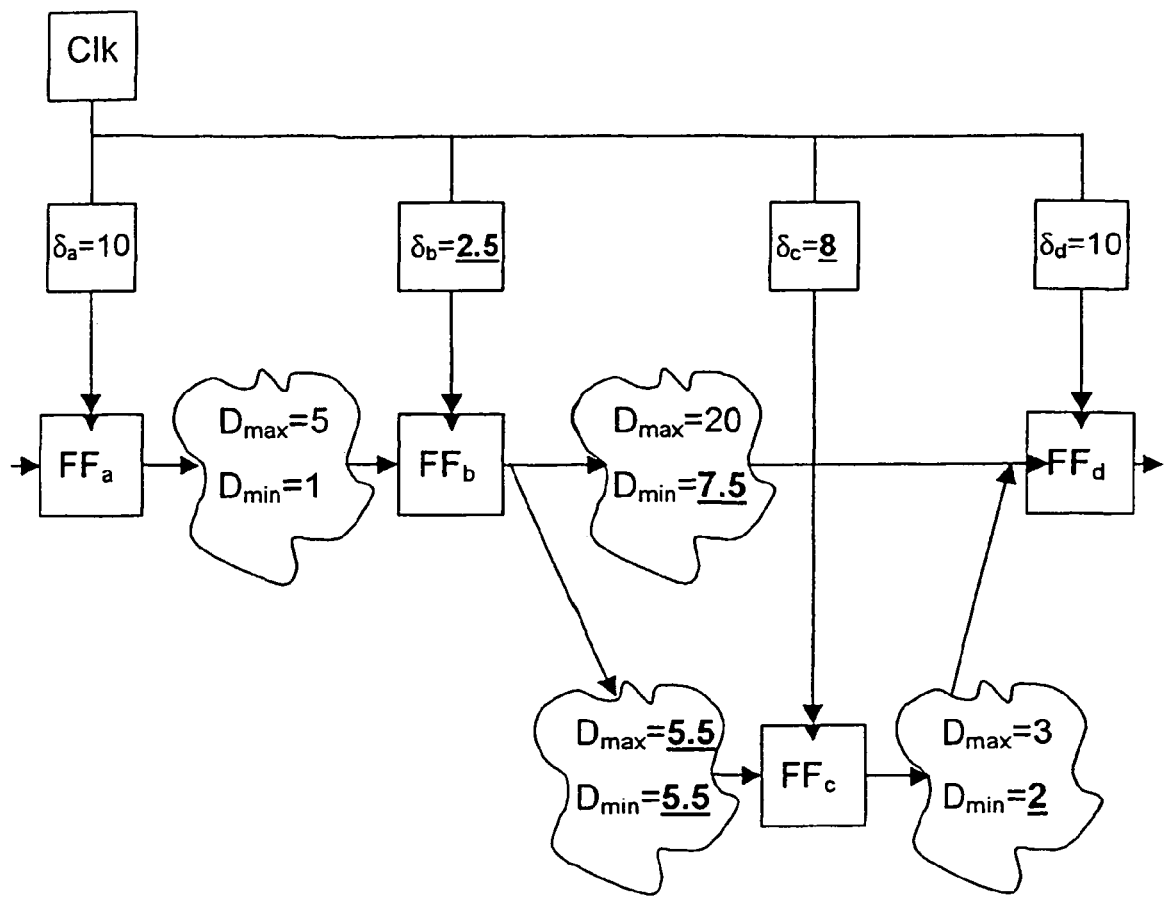
FIG. 11 shows the circuit of FIG. 6 modified according to the table of FIG. 10.
Figure 12:
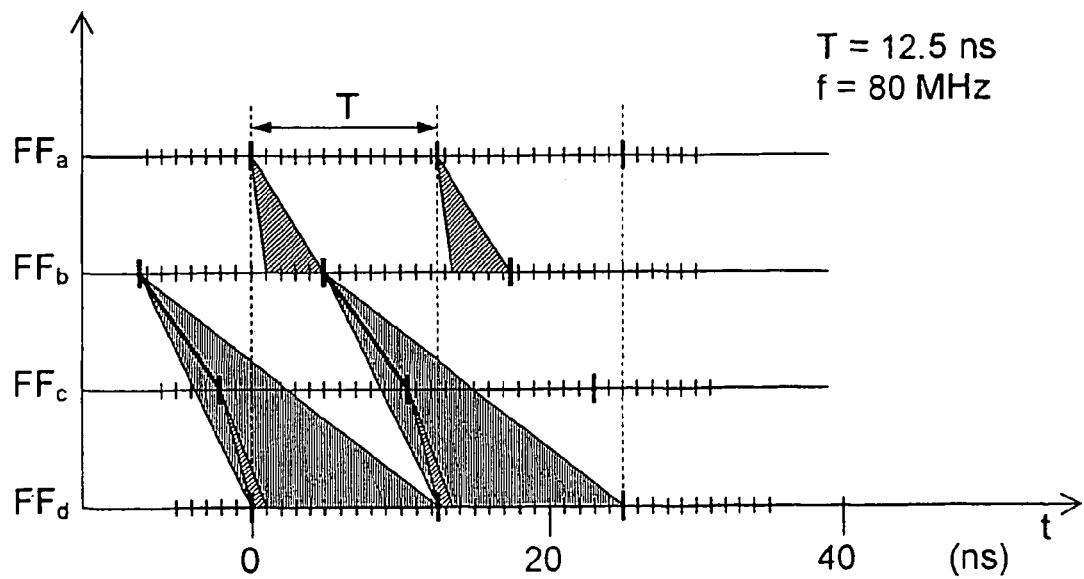
FIG. 12 shows a timing diagram for the circuit of FIG. 11.

It can be seen from the table of FIG. 8 that in order to obtain the ideal value of the clock period of 12.5 ns corresponding to a clock frequency of 80 MHz defined by the longest delays as mentioned above, the $D_{min}$ value for the path b-c-d must be extended to 7.5 ns. To avoid path b-d from becoming the new restriction, its $D_{min}$ value must be extended to 7.5 ns as well. Since $D_{max}$ must be greater than or equal to $D_{min}$ for any path, $D_{max[b,c]}$ must also be extended, but that can be done without any influence on the result, because the value is small compared to the longest delays. The result is shown in the table of FIG. 10. The corresponding circuit and timing diagram are shown in FIGS. 11 and 12.

It will also be seen from FIG. 12 why the clock period cannot be reduced to values below 12.5 ns when the registers $FF_a$ and $FF_d$ have to be clocked simultaneously, as will normally be a requirement from surrounding circuitry. $D_{max[a,b]} + D_{max[b,d]}$ must be less than two clock periods, or in other words the clock period cannot be less than the mean value of $D_{max}$ for the path having the longest total delay, as has been mentioned earlier.

Figures 13, 14:
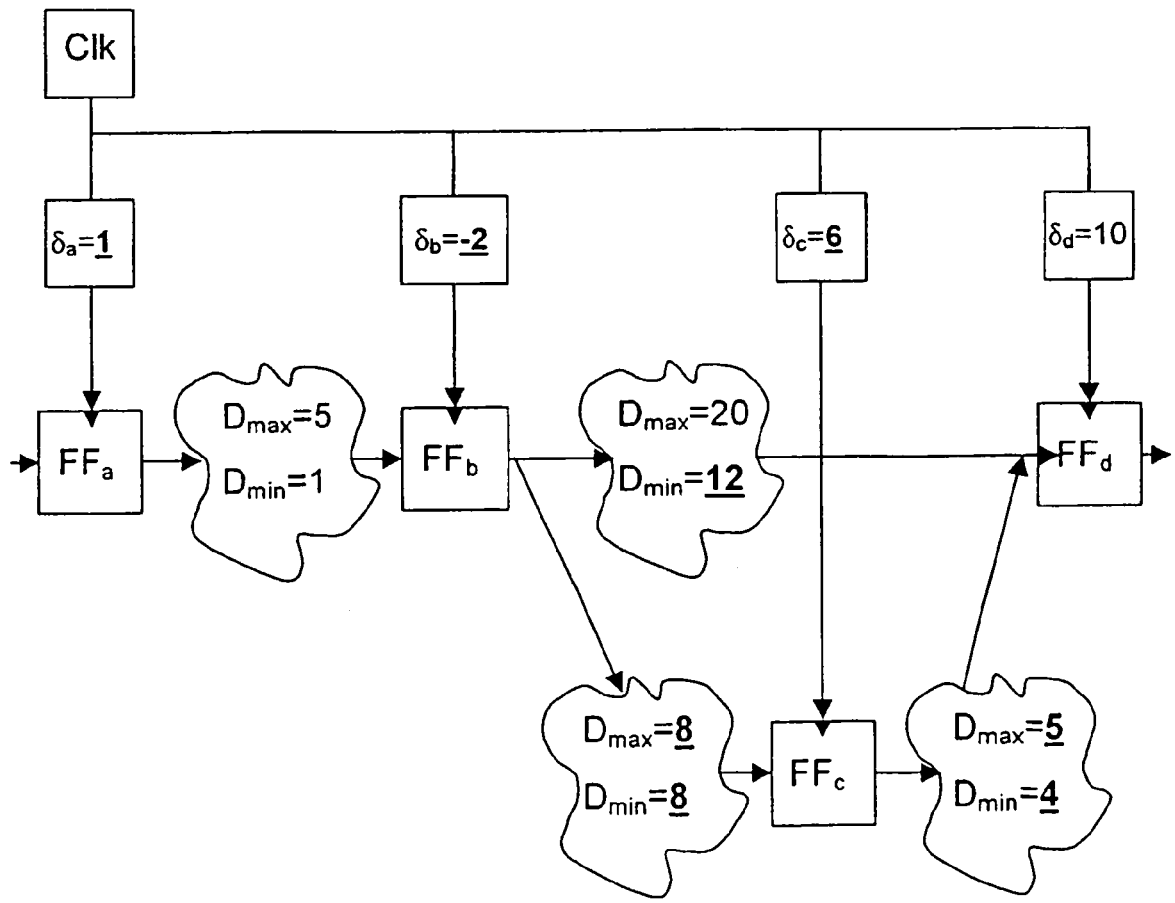
FIG. 13 shows an alternative table of difference values calculated with extended minimum delay values.
FIG. 14 shows the circuit of FIG. 6 modified according to the table of FIG. 13.
Figure 15:
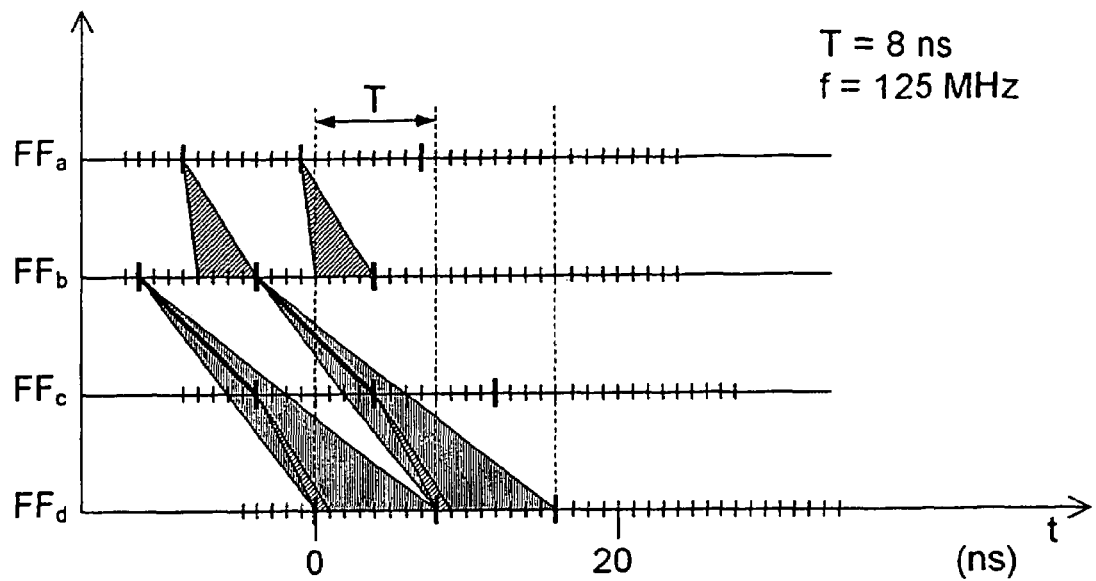
FIG. 15 shows a timing diagram for the circuit of FIG. 14.

If, however, this requirement does not exist, the clock period can be reduced further. An example is illustrated in FIGS. 13, 14 and 15 in which the clock period has been reduced to 8 ns corresponding to a clock frequency of 125 MHz. However it must be noted that in this example the clock skew exceeds the clock period, and this will only be possible when no external circuits require synchronism between the input and the output.

Figure 16:
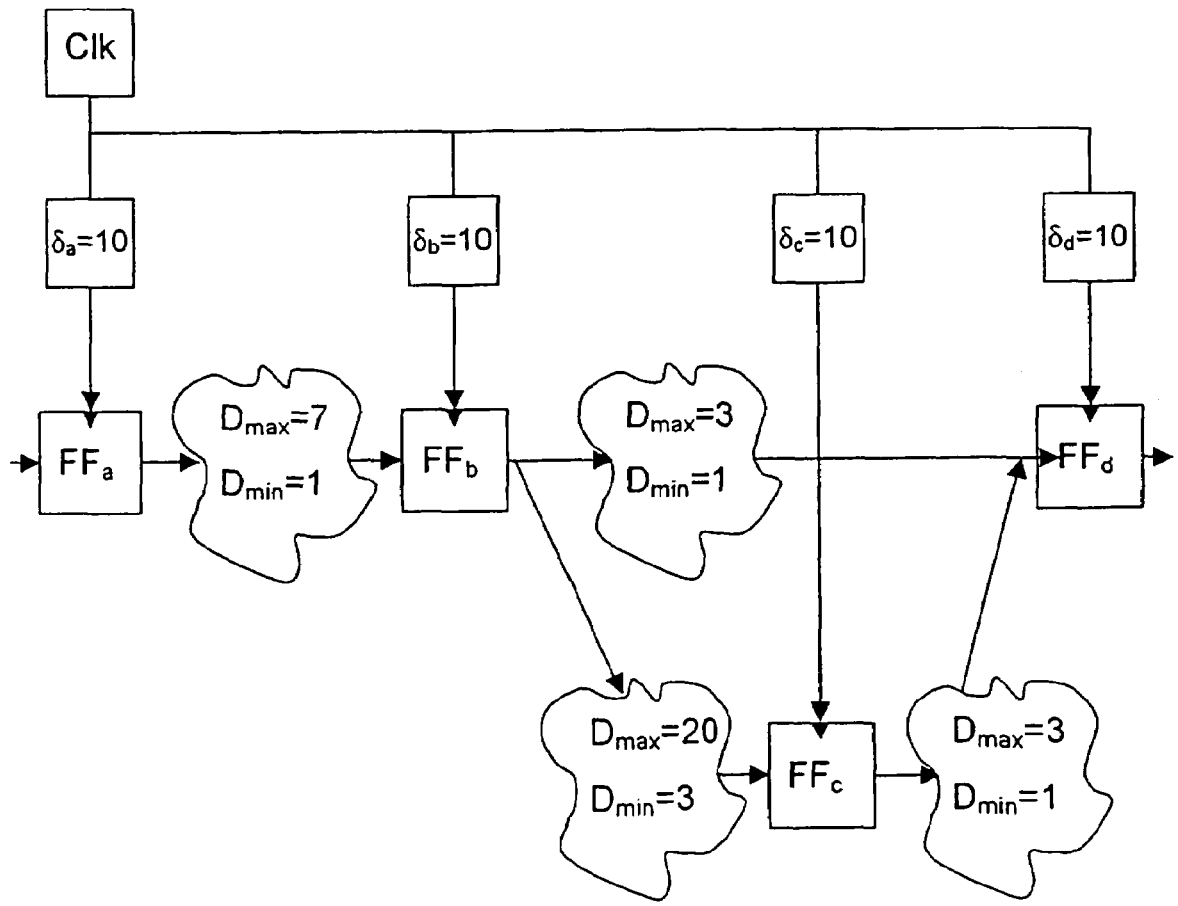
FIG. 16 shows the circuit of FIG. 1 with alternative examples of specific values of the delays.

To illustrate the calculation of the obtainable clock periods, another example will be briefly described. FIG. 16 shows a circuit similar to that of FIG. 3, but now the longest delay is located between $FF_b$ and $FF_c$. With zero-skew clocking the shortest clock period is again 20 ns because $D_{max[b,c]}=20$ ns, and the timing is shown in FIG. 17.

First the optimal clock period according to (3) is calculated. If it is again supposed that $FF_a$ and $FF_d$ must be clocked simultaneously, the path with the longest delay is a-b-c-d, and the mean value of $D_{max}$ for this path is $(7+20+3)/3=10$ ns, and thus the clock period cannot be reduced below this value.

Figures 17, 18:
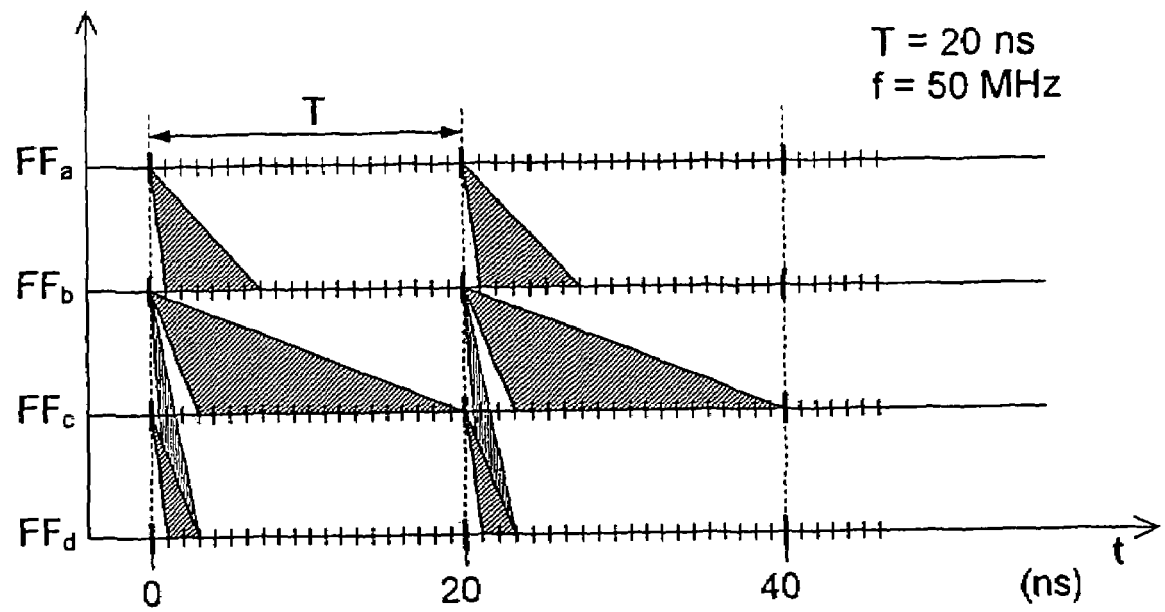
FIG. 17 shows a timing diagram for the circuit of FIG. 16.
FIG. 18 shows a table of difference values calculated for the circuit of FIG. 16.

The difference values according to (5) are calculated in the table of FIG. 18. Here it is especially noted that the value for the two parallel paths from $FF_b$ to $FF_d$ is calculated as $((20+3)-1)/2=11$ ns according to formula (5) above, because the highest sum of the $D_{max}$ values has two components. The highest difference value is 17 ns for the path b-c, and thus with the conventional intentional skew scheme the clock period can be reduced to 17 ns as shown in the timing diagram of FIG. 19.

Figures 19, 20:
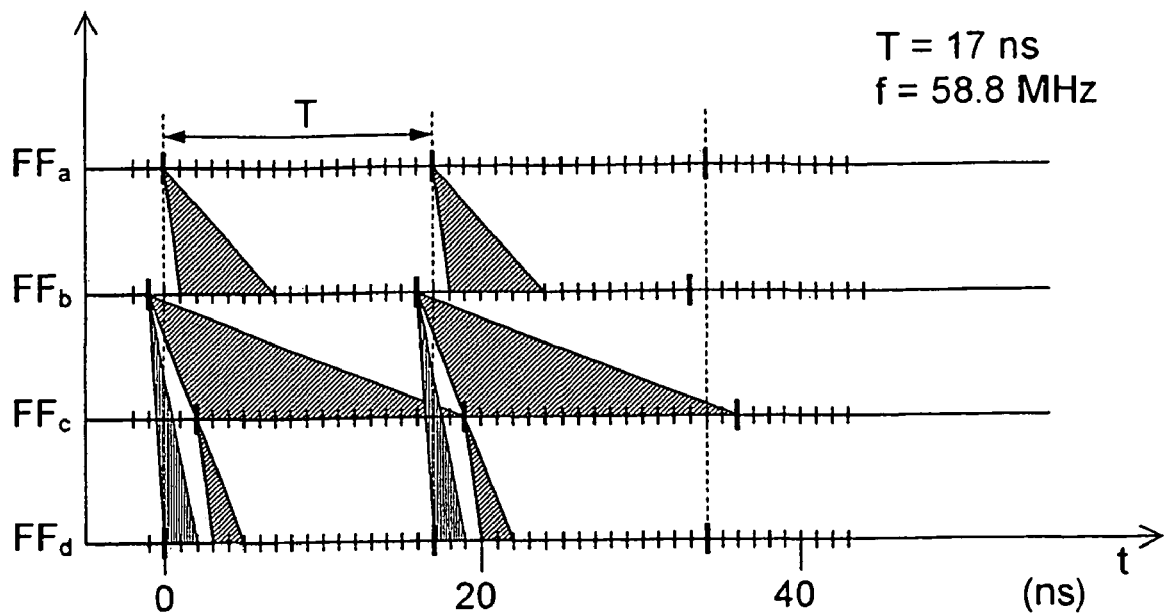
FIG. 19 shows a timing diagram for the circuit of FIG. 16 modified with intentional clock skew.
FIG. 20 shows a table of difference values for the circuit of FIG. 16 calculated with extended minimum delay value for one path.
Figures 21, 22:
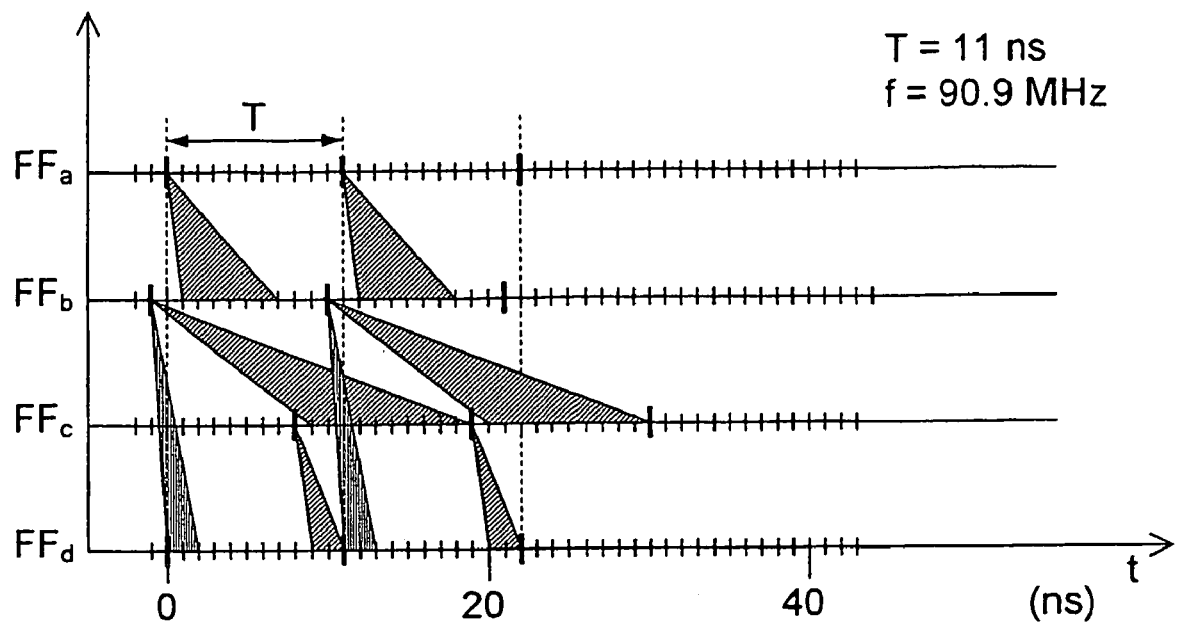
FIG. 21 shows a timing diagram for the circuit of FIG. 16 modified according to the table of FIG. 20.
FIG. 22 shows a table of difference values for the circuit of FIG. 16 calculated with extended minimum delay values for two paths.
Figure 23:
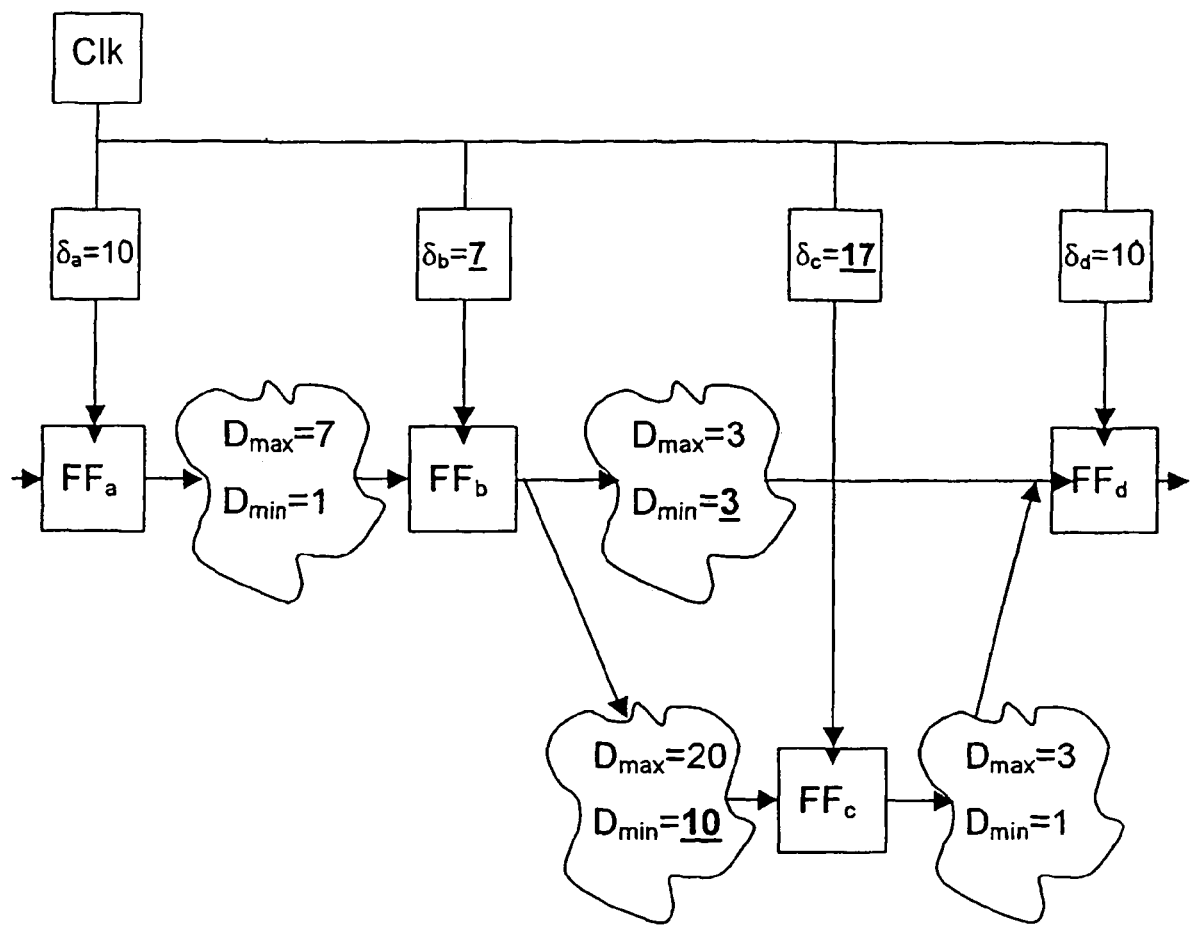
FIG. 23 shows the circuit of FIG. 16 modified according to the table of FIG. 22.
Figure 24:
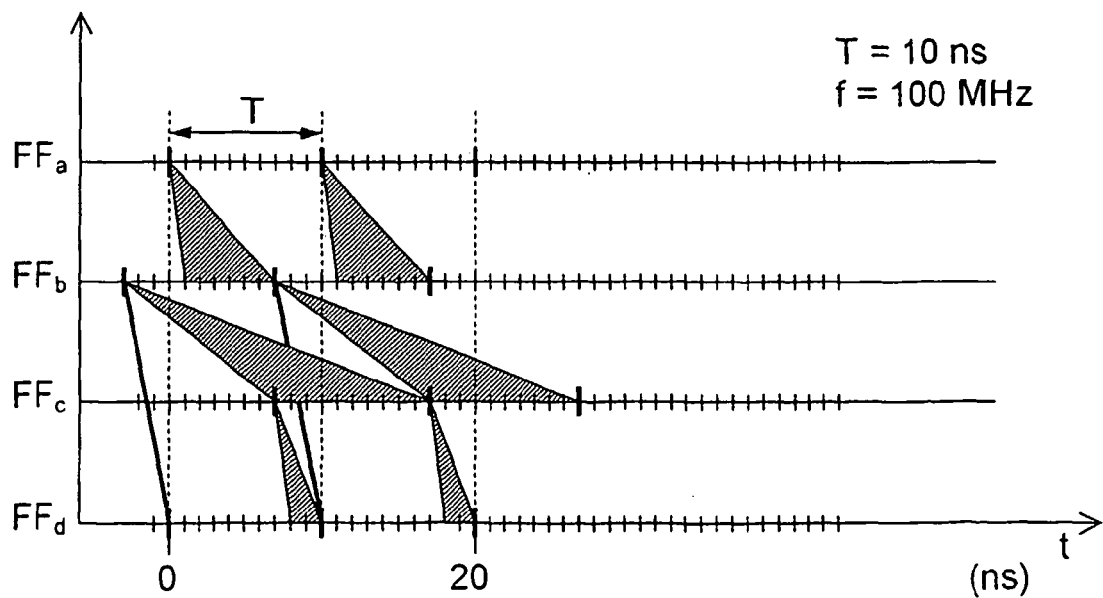
FIG. 24 shows a timing diagram for the circuit of FIG. 23.

In order to reduce the clock period further according to the invention, the highest difference value of 17 ns for the path b-c must be reduced to 10 ns, and therefore $D_{min[b,c]}$ is increased to 10 ns. The result is shown in FIGS. 20 and 21, from which it will be seen that now the difference value for the path b-d/b-c-d (11 ns) is the limiting factor. Consequently, also this difference value has to be reduced, and $D_{min[b,d]}$ is therefore increased to 3 ns. The final result is shown in the table of FIG. 22 and the corresponding circuit in FIG. 23. The timing is illustrated in FIG. 24.

In the above examples it has been described how much the clock period can be reduced. However, it should be mentioned that the idea of the invention is to reduce the clock period, and thus increase the clock frequency, but not necessarily as much as possible. In the example just mentioned above, the clock period could be reduced from 17 ns to 10 ns. If, for example, a clock period of 15 ns is needed, a good and safe solution could be to extend $D_{min[b,c]}$ from 3 ns to 6 ns, which would allow a clock period of 14 ns, thus providing one extra nanosecond as a safety margin.

As illustrated in FIG. 9, one way of increasing the shortest delay between two registers is to insert one or more cascaded buffers somewhere in the combinational path between the two registers. However, several other possibilities exist, and some of them are:

- cascaded buffers at the output of sending register
- cascaded buffers at the input of receiving register
- resizing and rearranging combinatorial gates
- latch immediately downstream of the output of the sending register.
- latch immediately upstream of the input of the receiving register
- replacing sending register with one with built-in second slave stage, i.e. sending out on opposite edge compared to the receiver sampling and its own input
- replacing receiving register with one with built-in second master stage, i.e. sampling on opposite edge compared to the sender and its own output
- a combination of any of the above.

It should be noted that the invention as described above can be used in the design of a circuit from the beginning, or it can be used to improve an existing circuit. Thus a circuit can be designed by using the existing methods of clock skew scheduling while ignoring the expression (5) in order to obtain an optimal schedule. Then afterwards those of the shortest delays showing a race condition can be increased according to the invention.

Although a preferred embodiment of the present invention has been described and shown, the invention is not restricted to it, but may also be embodied in other ways within the scope of the subject-matter defined in the following claims.

The invention claimed is:

1. A method of modifying a design of a synchronous digital circuit comprising a plurality of clocked storage devices and a plurality of combinational logic elements defining combinational paths between at least some of the clocked storage devices, each combinational path from an output of a first one of the clocked storage devices to an input of a second one of the clocked storage devices having a minimum delay value and a maximum delay value, such that the actual delay of the path assumes a value between the minimum delay value and the maximum delay value, the method comprising the steps of:

identifying among the combinational paths a combinational path having a greatest difference between the maximum delay value and the minimum delay value, and reducing the difference between the maximum delay value and the minimum delay value by increasing the minimum delay value for the combinational path having the greatest difference, wherein the greatest difference in case of parallel paths is calculated as a difference between the highest maximum delay value and the lowest minimum delay value of the parallel paths, the maximum delay value for a sequential path is calculated as a sum of the maximum delay values for the paths comprised in the sequential path, and the minimum delay value for a sequential path is calculated as a sum of the minimum delay values for the paths comprised in the sequential path.

2. A method of claim 1, wherein the step of increasing the minimum delay value for a combinational path is performed by inserting a plurality of buffers in the combinational path.

3. A method of modifying a design of a synchronous digital circuit comprising a plurality of clocked storage devices and a plurality of combinational logic elements defining combinational paths between at least some of the clocked storage devices, each combinational path from an output of a first one of the clocked storage devices to an input of a second one of the clocked storage devices having a minimum delay value and a maximum delay value, such that the actual delay of the path assumes a value between the minimum delay value and the maximum delay value, the method comprising the steps of:

identifying among the combinational paths a combinational path having a greatest difference between the maximum delay value and the minimum delay value, reducing the difference between the maximum delay value and the minimum delay value by increasing the minimum delay value for the combinational path having the greatest difference, identifying among sequential paths from an input to an output of the circuit and sequential paths defining loops in the circuit a sequential path having a highest mean value of the maximum delay values, calculating the highest mean value of the maximum delay values, identifying those paths for which a difference between the maximum delay value and the minimum delay value exceeds the highest mean value of the maximum delay values, and reducing the differences exceeding the highest mean value of the maximum delay values to be less than or equal to the highest mean value of the maximum delay values.

4. A system for modifying the design of a synchronous digital circuit comprising a plurality of clocked storage devices and a plurality of combinational logic elements defining combinational paths between at least some of the clocked storage devices, each combinational path from an output of a first one of the clocked storage devices to an input of a second one of the clocked storage devices having a minimum delay value and a maximum delay value, such that an actual delay of the path assumes a value between the minimum delay value and the maximum delay value, the system comprising:

means for identifying among the combinational paths a combinational path having a greatest difference between the maximum delay value and the minimum delay value, means for reducing the difference between the maximum delay value and the minimum delay value by increasing the minimum delay value for the combinational path having the greatest difference, wherein the system is adapted to calculate the greatest difference in case of parallel paths as the difference between the highest maximum delay value and the lowest minimum delay value, to calculate the maximum delay value for a sequential path as the sum of the maximum delay values for the paths comprised in the sequential path, and to calculate the minimum delay value for a sequential path as the sum of the minimum delay values for the paths comprised in the sequential path.

5. A system of claim 4, wherein the system is adapted to increase the minimum delay value for a combinational path by the insertion of a plurality of buffers in the combinational path.

6. A system for modifyig the design of a synchronous digital circuit comprising a plurality of clocked storage devices and a plurality of combinational logic elements defining combinational paths between at least some of the clocked storage devices, each combinational path from an output of a first one of the clocked storage devices to an input of a second one of the clocked storage devices having a minimum delay value and a maximum delay value, such that an actual delay of the path assumes a value between the minimum delay value and the maximum delay value, the system comprising:

means for identifying among the combinational paths a combinational path having a greatest difference between the maximum delay value and the minimum delay value, means for reducing the difference between the maximum delay value and the minimum delay value by increasing the minimum delay value for the combinational path having the greatest difference, means for identifying among sequential paths from an input to an output of the circuit and sequential paths defining loops in the circuit the sequential path having the highest mean value of the maximum delay values, means for calculating the highest mean value of the maximum delay values, means for identifying those paths for which a difference between the maximum delay value and the minimum delay value exceeds the highest mean value of the maximum delay values, and means for reducing the differences exceeding the highest mean value of the maximum delay values to be less than or equal to the highest mean value of the maximum delay values.

7. A machine readable medium comprising instructions for causing a processing unit to modify a design of a synchronous digital circuit including a plurality of clocked storage devices and a plurality of combinational logic elements defining combinational paths between at least some of the clocked storage devices, each combinational path from an output of a first one of the clocked storage devices to an input of a second one of the clocked storage devices having a minimum delay value and a maximum delay value such that the actual delay of the path assumes a value between the minimum delay value and the maximum delay value, wherein the instructions cause the processing unit to perform:

identifying the combinational path having the greatest difference between the maximum delay value and the minimum delay value; and reducing the difference between the maximum delay value and the minimum delay value by increasing the minimum delay value for the combinational oath having the largest difference;

wherein the medium comprises instructions for causing the processing unit to:

calculate the greatest difference in case of parallel paths as a difference between a highest maximum delay value and a lowest minimum delay value;

calculate a maximum delay value for a sequential path as a sum of maximum delay values for paths comprised in the sequential path; and calculate a minimum delay value for the sequential path as a sum of minimum delay values for paths comprised in the sequential path.

8. The medium of claim 7, wherein the medium comprises instructions for causing the processing unit to increase a minimum delay value for a combinational path by inserting a plurality of buffers in the combinational path.

9. A machine readable medium comprising instructions for causing a processing unit to modify a design of a synchronous digital circuit including a plurality of clocked storage devices and a plurality of combinational logic elements defining combinational paths between at least some of the clocked storage devices, each combinational path from an output of a first one of the clocked storage devices to an input of a second one of the clocked storage devices having a minimum delay value and a maximum delay value such that the actual delay of the path assumes a value between the minimum delay value and the maximum delay value, wherein the instructions cause the processing unit to perform:

identifying the combinational path having the greatest difference between the maximum delay value and the minimum delay value; and reducing the difference between the maximum delay value and the minimum delay value by increasing the minimum delay value for the combinational path having the largest difference;

wherein the medium comprises instructions for causing the processing unit to perform:

identifying among sequential paths from an input to an output of the circuit and sequential paths defining loops in the circuit the sequential path having the highest mean value of the maximum delay values, calculating the highest mean value of the maximum delay values, identifying those paths for which a difference between a maximum delay value of the path and a minimum delay value of the path exceeds the highest mean value of the maximum delay values, and reducing the differences exceeding the highest mean value of the maximum delay values to be less than or equal to the highest mean value of the maximum delay values.

* * * * *